United States Patent [19]
Thummalapally et al.

[11] Patent Number: 6,016,270
[45] Date of Patent: Jan. 18, 2000

[54] FLASH MEMORY ARCHITECTURE THAT UTILIZES A TIME-SHARED ADDRESS BUS SCHEME AND SEPARATE MEMORY CELL ACCESS PATHS FOR SIMULTANEOUS READ/WRITE OPERATIONS

[75] Inventors: Damodar Reddy Thummalapally, San Jose; Abhijit Ray, Santa Clara, both of Calif.

[73] Assignee: Alliance Semiconductor Corporation, San Jose, Calif.

[21] Appl. No.: 09/036,558

[22] Filed: Mar. 6, 1998

[51] Int. Cl.[7] .................................................. G11C 16/04
[52] U.S. Cl. ............................... 365/185.11; 365/185.29; 365/185.33; 365/189.04
[58] Field of Search ...................... 365/185.11, 185.29, 365/185.33, 189.04

[56] References Cited

U.S. PATENT DOCUMENTS

| | | | |
|---|---|---|---|
| 5,245,572 | 9/1993 | Hosonocky et al. ................ | 365/189.02 |
| 5,638,323 | 6/1997 | Itano .................................. | 365/185.22 |
| 5,822,244 | 10/1998 | Hansen et al. ..................... | 365/185.11 |

OTHER PUBLICATIONS

AMD Publication #21357, "Am29DL800T/Am29DL800B, 8 Megabit (1MX8–Bit/512KX16–Bit), CMOS 3.0 Volt–only, Simultaneous Operation Flash Memory", Rev. A, May 1997, pp. 1–38.

*Primary Examiner*—David Nelms
*Assistant Examiner*—Hoai V. Ho
*Attorney, Agent, or Firm*—Limbach & Limbach LLP

[57] ABSTRACT

A flash memory architecture relies on a single, time-shared address bus to enable a read operation to be performed simultaneously with an algorithm operation when the read operation is targeted for a memory cell block that is not currently tagged for an algorithm operation. After a read address has been latched into the array block selected for the read operation, the address bus is "free" for the remainder of the read operation cycle. During this free time, the address bus can be used for algorithm operations to load the counter address into an active tagged block in the array. Separate global data I/O lines are provided to facilitate simultaneous read and algorithm operations.

12 Claims, 13 Drawing Sheets

FLASH MEMORY ARCHITECTURE THAT UTILIZES A TIME-SHARED ADDRESS BUS SCHEME AND SEPARATE MEMORY CELL ACCESS PATHS FOR SIMULTANEOUS READ/WRITE OPERATIONS

BACKGROUND OF THE INVENTION

1. Field of the Invention

The present invention relates to non-volatile memory arrays and, in particular, to a flash memory array architecture that utilizes a time-shared address bus and separate memory cell access paths to perform read cycle operations in one memory cell block in the array while an algorithm operation, such as an erase/reprogram operation, is performed simultaneously in another memory cell block in the array. The multiplexed address bus architecture avoids the need for the complex, multiple address bus structures previously required to implement simultaneous read/write operations in a flash memory architecture.

2. Discussion of the Related Art

U.S. Pat. No. 5,245,572, issued on Sep. 14, 1993, to Kosonocky et al., discloses a flash memory architecture that includes two separate memory cell banks that can be simultaneously and individually addressed to perform a read operation in one bank of cells while an erase/reprogram operation is being performed in the other bank of cells.

In the Kosonocky et al. architecture, an address register is provided for storing an address for one of the memory cell banks. A second address register is provided for storing a second address for the second memory cell bank. A multiplexer selectively couples either the first memory cell bank or the second memory cell bank, one at a time, to the memory device output. Array select circuitry that responds to an incoming address signal selects one of the memory cell banks for a reprogramming operation and the other memory cell bank for a read operation. The array select circuitry also controls the multiplexer for coupling the memory cell bank that is being read to the device outputs during the reprogramming of the other memory cell bank.

Advanced Micro Devices Publication #21357, Rev: A, "Am29DL800T/Am29DL800B, 8 Megabit (1M×8-bit/ 512K×16-bit) CMOS Volt-only, Simultaneous Operation Flash Memory", May 1997, discloses a flash memory architecture that also provides for simultaneous read/write operations by dividing the memory space into two banks. The AMD device allows a host system to program or erase one memory cell bank, then immediately and simultaneously read from the other bank, with zero latency.

A drawback associated with both the Kosonocky et al. architecture and the AMD architecture is that both rely on separate address bus structures for each of the two memory cell banks and, therefore, are only suitable for a two-bank architectural scheme. Thus, if the simultaneous read/write concept of these architectures is to be expanded to the sector or block level (multiple banks), then the address bus structure necessarily becomes prohibitively complex and write sense amplifiers, program load, data latch and data compare logic must be repeated for each memory cell bank in the array.

SUMMARY OF THE INVENTION

The present invention provides a flash memory architecture that relies on a single time-shared address bus and separate global read and write data lines to enable a read operation to be performed simultaneously with an algorithm operation, such as an erase/reprogram operation, when the read operation is targeted for a memory cell block that is not currently tagged for an algorithm operation. A "tagged" block means that the block has been selected for an algorithm operation.

The flash architecture includes latch capability for word line WL driver, column decode Y-Z driver and block select logic. Thus, after an address has been loaded into the selected array block at the start of a read cycle, the address bus is then "free", that is, not in use for the read cycle, both during read sensing and during the delay time required to propagate the read sense amplifier data to the input/output (I/O) pins of the device. During this "free" time, which includes equalization, sensing, sense amplification and output propagation through output buffers, when the address bus is not in use for the read operation, the address bus can be used for algorithm operations. Separate global data lines are provided to facilitate simultaneous read and algorithm operations.

Read operations have the highest priority to obtain access to the internal time-shared address bus. A read operation can be performed on array blocks that are not selected (tagged) for byte program/erase operations while an algorithm operation is in progress without penalty on read access time. It will be appreciated by those skilled in the art that a read operation can always be performed when an algorithm operation is in progress. Since the byte program address is loaded into the selected array block during the input command sequence, the internal address bus is not required during byte program algorithm execution and, thus, there is zero overhead on byte program time.

Since byte program involves an operation within one location of the array, no address loading phase is necessary when the program algorithm is in progress. Therefore, the address can be loaded into the selected array block during the input command sequence.

The time-shared address bus concept of the present invention is also useful for high speed synchronous devices to propagate decoded next address information to the inputs of word line WL driver and column decode Y-Z drivers for the next read cycle while the current read cycle is in progress.

Also, a flash memory architecture in accordance with the present invention does not require an Erase Suspend capability. In conventional architectures, the user must wait for the entire system to halt an erase operation before issuance of a read command. In the flash architecure of the present invention, a read request can be issued during an erase operation without issuing an Erase Suspend command. If the read operation involves the block that is being erased, then the user will receive the status of the erase operation. If the read operation involves untagged blocks, then the operation will be performed. However, a user that is interested in issuing an Erase Suspend command before reading data may still do so. Contrary to conventional architectures, the user can read data immediately.

A better understanding of the features and advantages of the present invention will be obtained by reference to the following detailed description and accompanying drawings which set forth an illustrative embodiment in which the concepts of the invention are utilized.

DETAILED DESCRIPTION OF THE INVENTION

Figure 1:
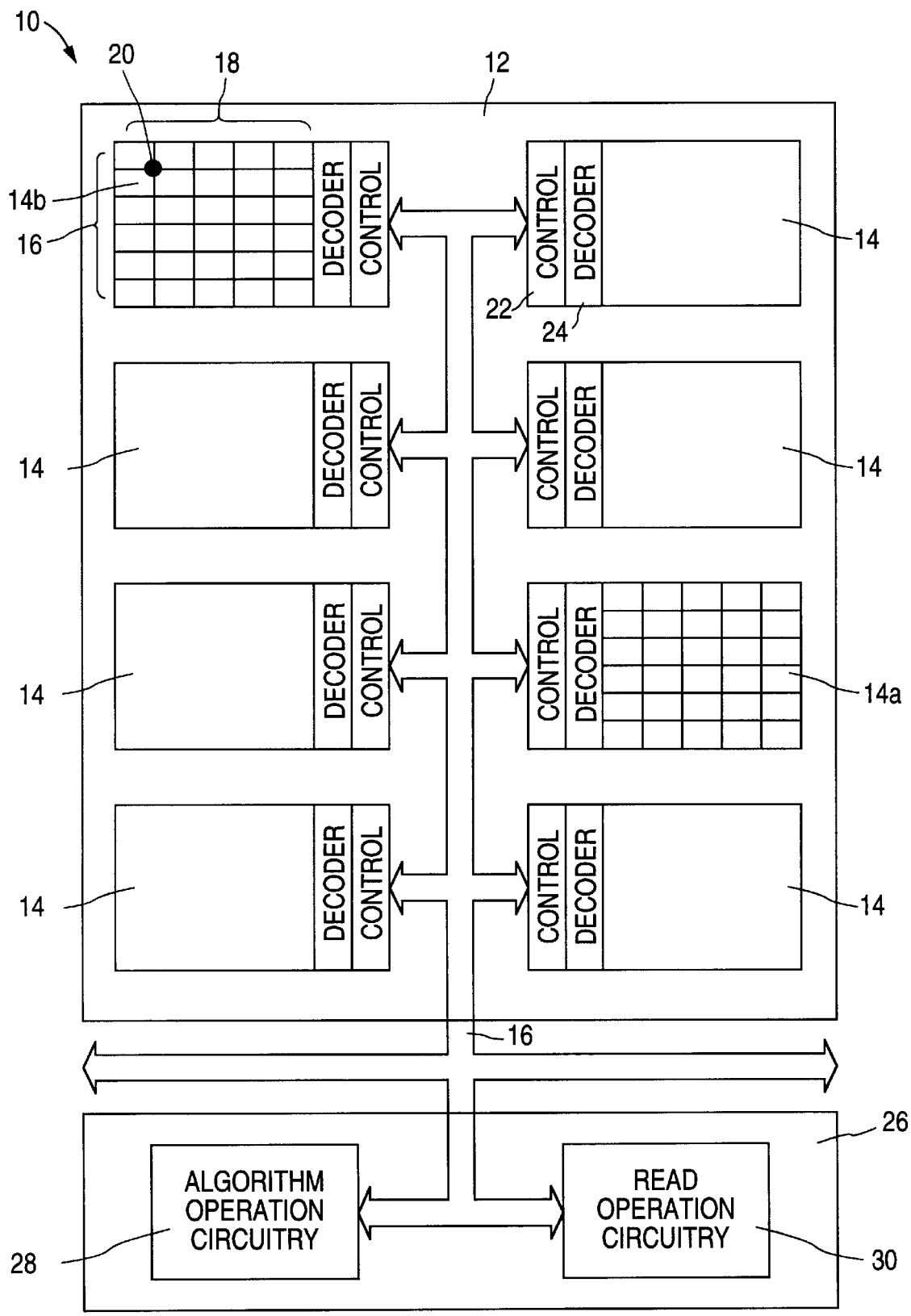
FIG. 1 is a block diagram illustrating a flash memory architecture that provides for simultaneous, block-level read/write operations in accordance with the concepts of the present invention.

FIG. 1 shows flash EEPROM circuitry 10 that includes a memory array 12 that is subdivided into a plurality of individually accessible array memory cell blocks 14. Array blocks 14a and 14b in FIG. 1 show that each array block 14 includes a plurality of rows 16 of conventional flash EEPROM cells and a plurality of columns 18 of such cells. Thus, each intersection of a row 16 and a column 18 within an array block 14 defines the location of a conventional flash EEPROM cell 20.

As further shown in FIG. 1, a multi-bit internal address bus 16 is connected to each array block 14 for providing address information to the array blocks 14. Each of the array blocks 14 includes block control logic 22 for implementing read operations and algorithm operations, such as write and erase, that are performed within the associated array block 14. Each array block 14 also includes decoder circuitry 24 for decoding address information provided via address bus 16 for access to a specified memory cell(s) 20 of a selected array block 14.

The FIG. 1 flash EEPROM circuitry 10 also includes command user interface, algorithm sequencer and read/write sequencer logic 26 connected to the address bus 16 for controlling both access on the address bus 16 and performance of various modes of operation within the memory cell array 12. Included in the logic 26 is algorithm operation circuitry 28 that responds to algorithm operation address information provided on the address bus 16. The algorithm operation address information identifies a selected array block, e.g. array block 14a, in the memory cell array 12 in which an algorithm operation, such as a write operation or an erase operation, is to be performed. The algorithm operation circuitry 28 implements the performance of the algorithm operation in the selected array block. The logic 26 also includes read operation circuitry 30 that responds to read operation address information provided on the address bus 16, including read operation address information provided during performance of an algorithm operation. The read operation address information identifies a second array block, e.g. array block 14b, in which a read operation is to be performed. In accordance with the concepts of the present invention, and as discussed in greater detail below, the algorithm operation can be implemented in one array block simultaneously with the read operation being performed in another array block.

In a preferred embodiment of the invention, each array block 14 is 512 columns wide by 512 rows deep. The 512 columns of each array block 14 are divided into eight column sectors such that each column sector includes sixty-four columns. Each of the column sectors is further subdivided into four groups of sixteen columns each. As discussed in greater detail below, each one of the sixteen columns in a column group may be connected to an associated global read data I/O line (DIOR). Similarly, each one of the sixteen columns in a column group may be connected to an associated global algorithm data I/O line (DIOW).

Those skilled in the art will appreciate that the size and number of array blocks 14 described herein is illustrative, not limiting. For example, a number of the array blocks 14 can be of a size that is suitable for storage of boot/parameter data, while the remainder of the blocks 14 can be of a larger size suitable for storage of core data.

Figure 2:
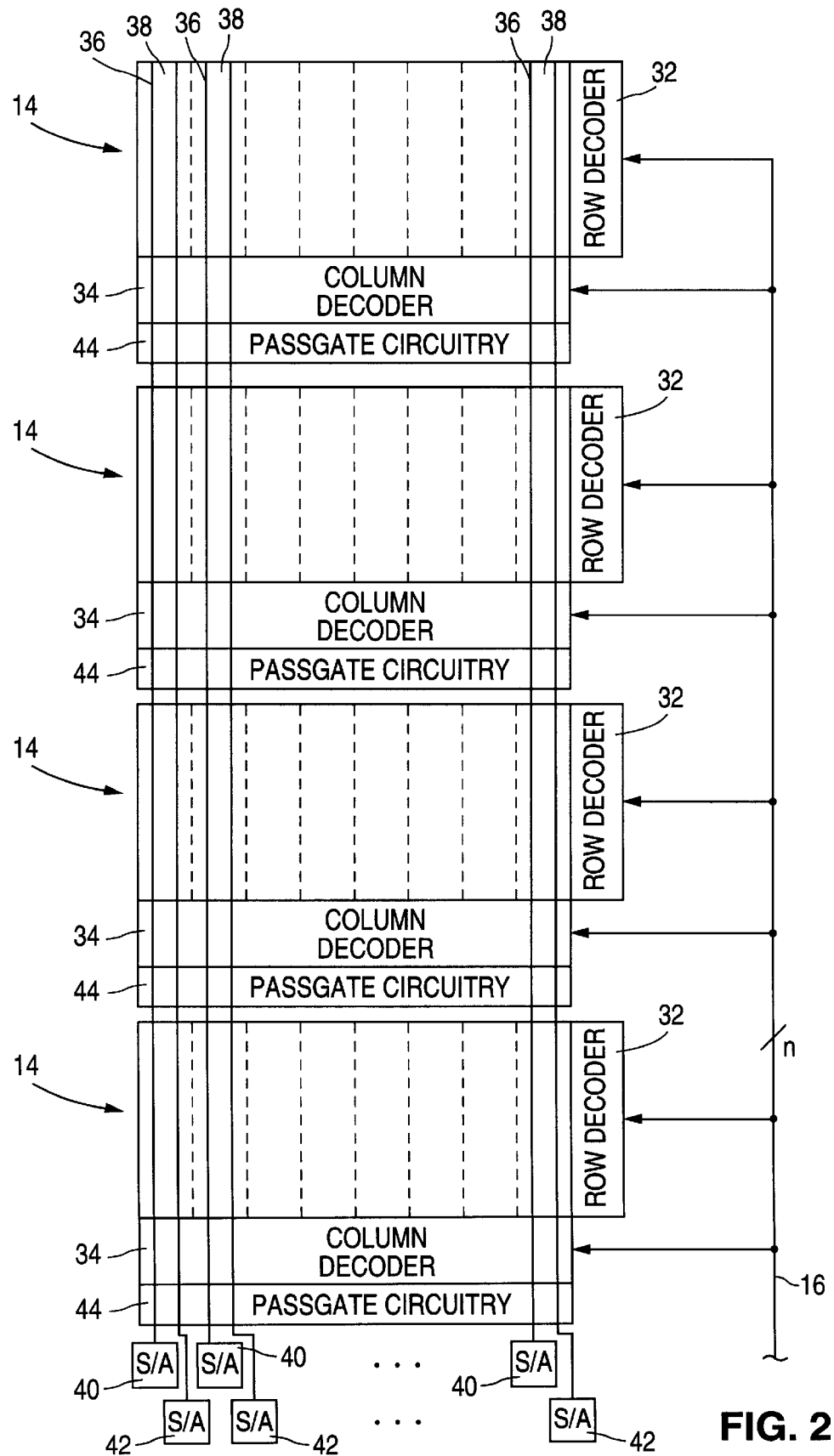
FIG. 2 is a block diagram providing a more detailed illustration of a portion of the FIG. 1 flash memory architecture.

FIG. 2 shows the architecture of the memory array 12 in greater detail; only one-half of the FIG. 1 array (i.e., the four "left-hand" array blocks 14 of FIG. 1) is shown. The memory array 12 includes a plurality of row decoders 32, a row decoder 32 being coupled to an associated array block 14 for selecting a specified row in the associated array block 14. The row decoders 32 decode a row address provided on the n-bit address bus 16 to select the specified row. In a preferred embodiment, the row address bits are received and latched into a word line WL driver latch (not shown).

FIG. 2 also shows a plurality of column decoders 34, a column decoder 34 being coupled to an associated array block 14 for selecting specified columns in the memory array 12 by decoding a column address provided on the address bus 16. In a preferred embodiment, the column address bits are received and latched into a column select Y-Z driver latch (not shown).

As further shown in FIG. 2, in accordance with the concepts of the present invention, two sets of global data I/O lines extend over the array 12. A read data I/O line (DIOR) 36 may be selectively connected, using passgate switching circuitry 44 described below, to any one of the sixty-four columns included in a column sector in any one of the "left-hand" array blocks 14. Similarly, an algorithm data I/O line (DIOW) 38 may be selectively connected, using the passgate switching circuitry 44, to any one of the sixty-four columns included in a column sector in any one of the "left-hand" array blocks 14. For purposes of clarity, only three of the eight pairs of read/algorithm data I/O lines 36, 38 are shown in FIG. 2. Each of the dedicated global read data I/O lines 36 is connected to an associated read sense amplifier 40. Similarly, each of the dedicated global algorithm data I/O lines 38 is connected to an associated algorithm sense amplifier 42. Those skilled in the art will appreciate that the read sense amplifiers 40 may be optimized for speed for read access time and that, since the verify cycles for algorithm operations are longer in duration, the write sense amplifiers can be optimized for area and power. (Those skilled in the art will also appreciate that the "right-hand" half of the array 12 is similarly constructed.)

Figure 3:
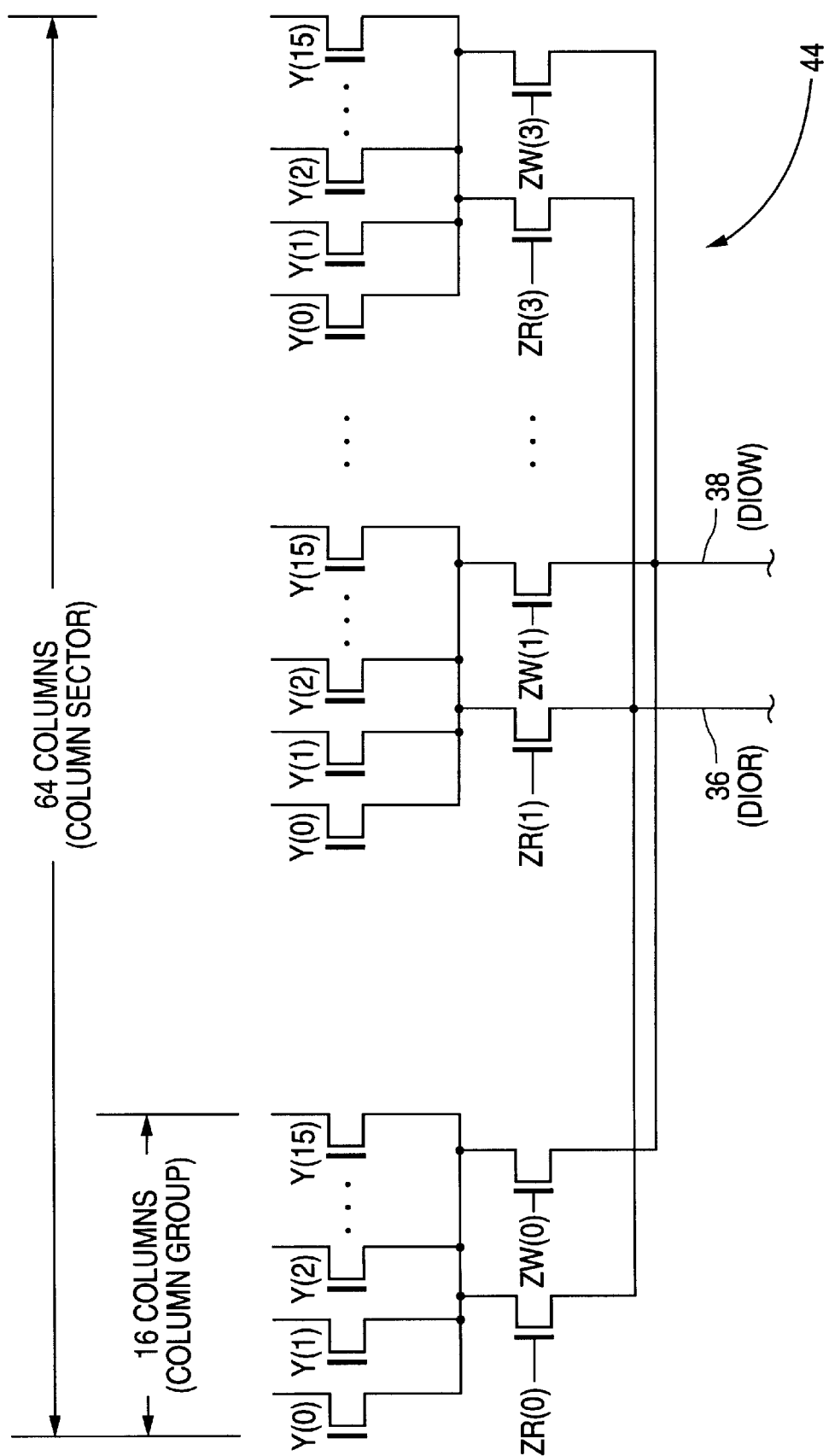
FIG. 3 is a schematic diagram illustrating a portion of an embodiment of a passgate switching mechanism utilizable for retrieving algorithm data signals and read data signals from a memory cell block of the FIG. 2 flash memory architecture.

An embodiment of the passgate switching circuitry 44 is shown in FIG. 3, which shows the switching circuitry 44 for one of the eight column sectors included in each of the four "left-hand" array blocks 14 in the memory array 12 (FIG. 2). Those skilled in the art will appreciate that the FIG. 3 circuitry is replicated for each of the remaining seven column sectors of the four "left-hand" array blocks 14 and, similarly, that the Fig.3 circuitry is replicated for each of the eight column sectors for the four "right-hand" array blocks 14 in the memory array 12.

As shown in FIG. 3, and as discussed above, each column sector is subdivided into four groups of sixteen columns each. A column select passgate Y(0)–Y(15) is provided for each one of the sixteen columns in a column group. Thus, the sixteen column select passgate transistors Y<0:15> are common for both read and algorithm access in an array block 14. The global read data I/O lines (DIOR) 36 and global algorithm data I/O lines 38 are then separated at a second level by a set of 1-of-4 column select passgates ZR<0:3> and ZW<0:3>.

As stated above, the global read data I/O lines 36 and global algorithm data I/O lines 38 are common for all array blocks 14. That is for each one of the sixty-four column array column sectors, there is one global DIOR line 36 and one global DIOW line 38 running parallel to the array columns. For array blocks 14 selected for algorithm operations, the associated signals ZR<0:3> are de-asserted (0 V) to isolate DIOW from DIOR. For array blocks not selected for algorithm operations, called read array blocks, the associated signals ZW<0:3> are de-asserted (0 V) to isolate DIOR from DIOW. From among the array blocks 14 "tagged" for an algorithm operation, only in the one array block targeted for a current algorithm operation, called an "active" tagged array block, one column from the column sector is connected to its associated global algorithm data I/O line DIOW 38, depending upon the respective Y<0:15>, ZW<0:3> signals, for algorithm operations. That is, only one tagged array block 14 is active at a time based on the counter address. This means that for all tagged, but not currently active, array blocks 14, signals ZW<0:3> are de-asserted (0 V).

As stated above, the read column address is decoded to generate column select control signals Y<0:15> and ZR<0:3> in the selected read array block 14, signals Y<0:15> and ZR<0:3> being used to connect one of the sixty-four columns in the column sector to the associated global read data I/O line DIOR 36. Similarly, the algorithm counter is decoded to generate column select control signals Y<0:15> and ZW<0:3> in the respective active tagged array block 14, signals Y<0:15> and ZW<0:3> being used to connect one of the sixty-four columns in the column sector to the associated global algorithm data I/O line DIOW 38.

Figure 3A:
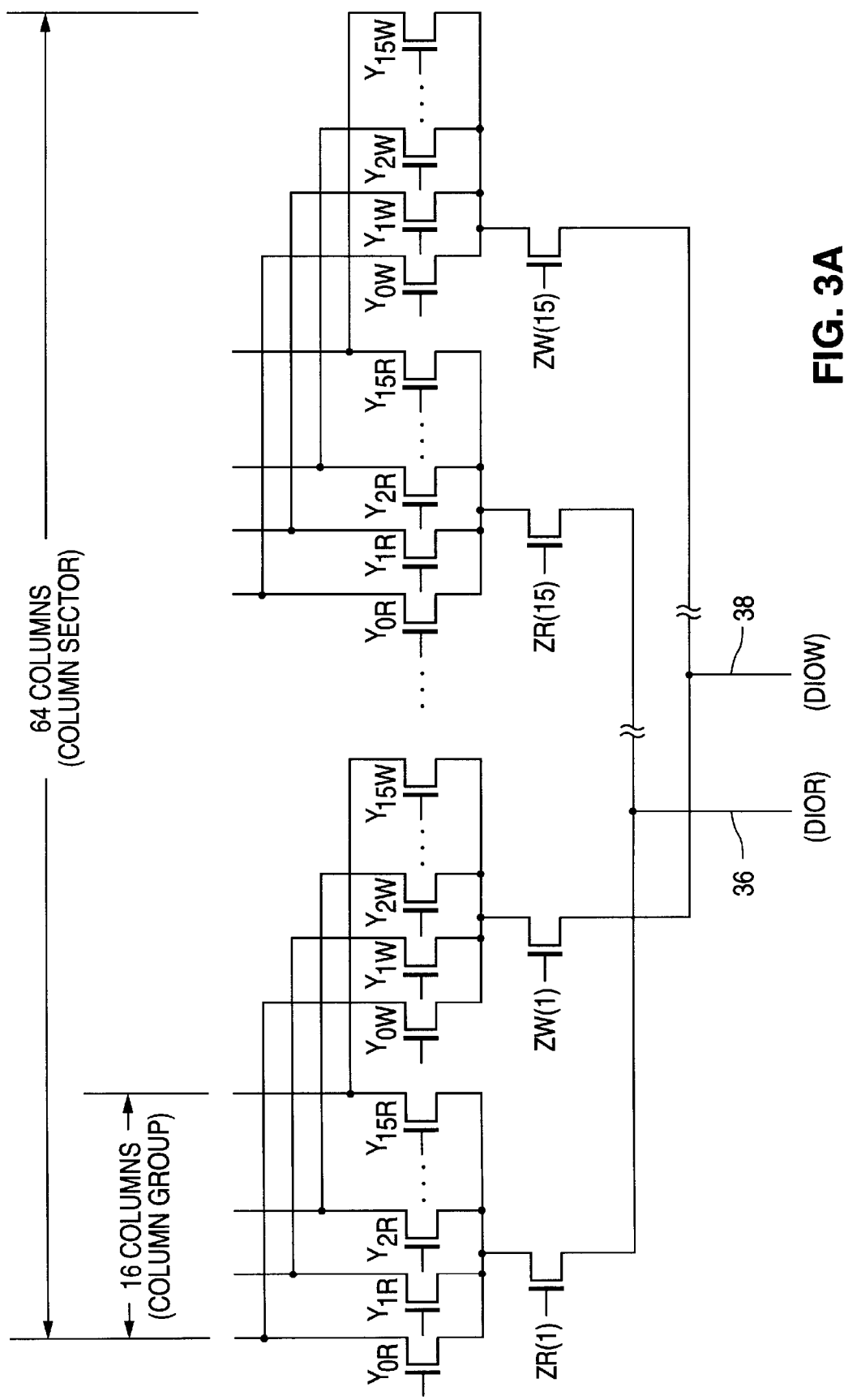
FIG. 3A is a schematic diagram illustrating a portion of an alternative embodiment of a passgate switching mechanism utilizable for retrieving algorithm data signals and read data signals from a memory cell block of the FIG. 2 flash memory architecture.

Those skilled in the art will appreciate that the invention is not limited by the embodiment of the passgate switching circuitry 44 shown in FIG. 3. For example, FIG. 3A shows an alternative embodiment in which a set of Y transistors is provided for each Z transistor. Other alternative passgate switching implementations are within the spirit and scope of the invention.

Figure 3B:
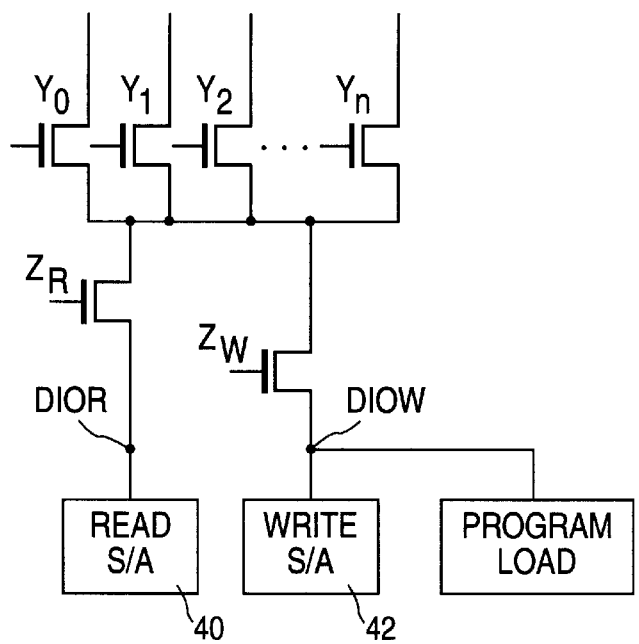
FIG. 3B is a partial schematic diagram illustrating voltage isolation of the read data and write data I/O lines.

As further stated above, global read data I/O lines (DIOR) 36 are connected to read sense amplifiers 40. Global algorithm data I/O lines (DIOW) 38 are connected to write sense amplifiers 42 and program loads. Since separate global data I/O lines are provided for read and algorithm operations, a read operation can be performed in read array blocks 14 while an algorithm operation is in progress in an active tagged array block 14, executing either verify or program or erase cycles or other algorithm sequencing steps. Thus, the global read data I/O lines (DIOR) 36 never see the high voltage intended for programming. This means that the read sense amplifiers 40 never see voltage levels greater than the power supply Vcc. More specifically, referring to FIG. 3B, during a write operation, the program load connects a high voltage (approx. 5 v) to the global write data I/O lines (DIOW) 38. Thus, the transistors in the write sense amplifier 42 must be large enough to handle this voltage. However, since this voltage will never be connected to DIOR, the read sense amplifiers 40 can be optimized for speed and low voltage operation.

To program a cell in a given column sector in an active block 14, the program loads place 4–6.5 V on respective DIOW lines 38. The voltage on the DIOW lines 38 is then coupled to the drain of the cell to be programmed.

There are two ways to erase an active block 14. According to one operation, signals ZW<0:3> are de-asserted and the global algorithm data I/O lines (DIOW) 38 are grounded; alternatively, the ZW<0:3> signals are not de-asserted if the DIOW lines 38 are floating.

Figure 3C:
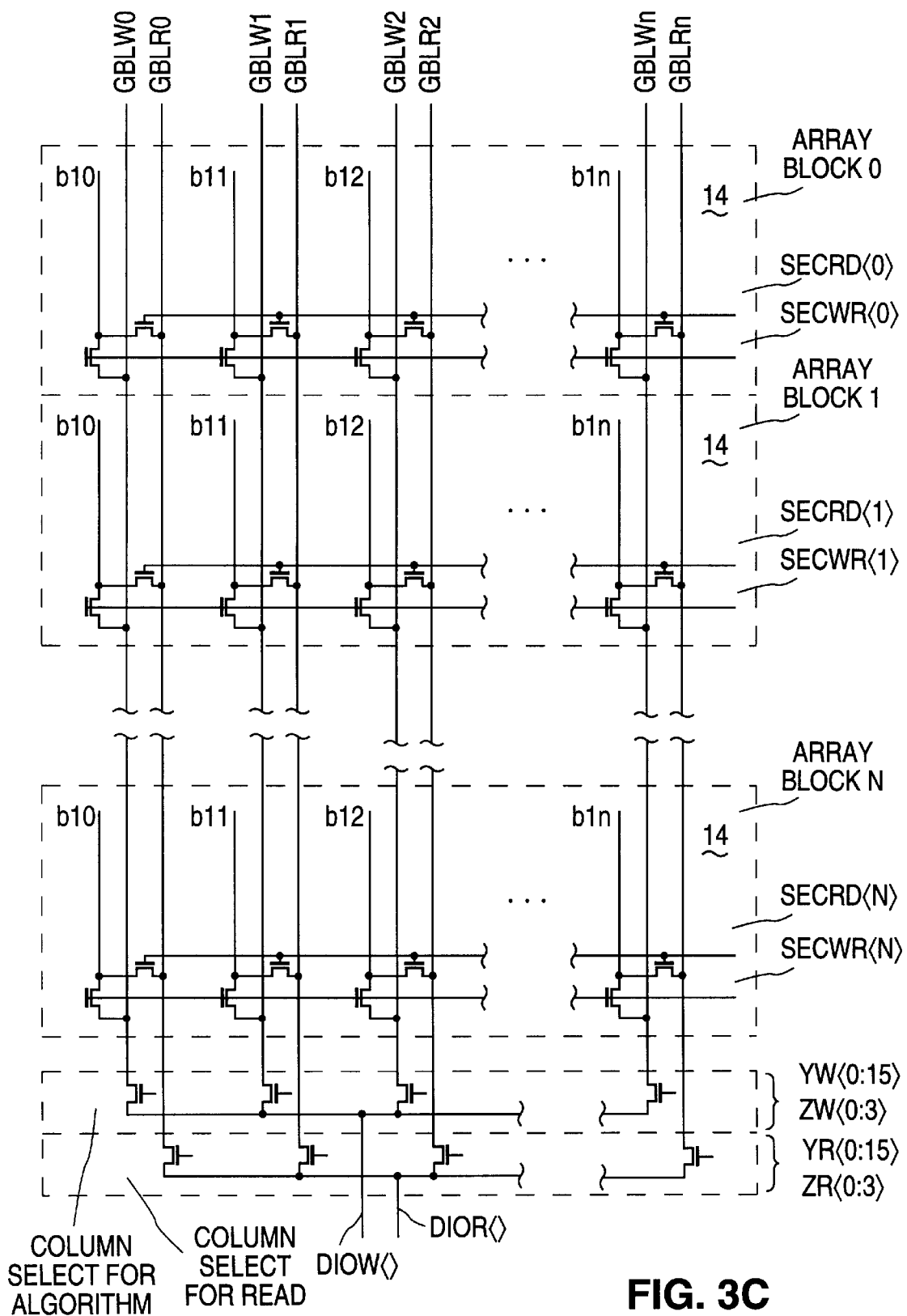
FIG. 3C is schematic diagram illustrating an alternative embodiment for the column access path of the FIG. 2 architecture.

FIG. 3C shows an alternative for the FIG. 2 column access path, the FIG. 3C embodiment providing separate column access paths for read and write through select transistors. Bit lines bl0–bln identify the bit lines within an array block 14. Global algorithm bit lines GBLW0–GBLWn are provided for algorithm operations; similarly, global read bit lines GBLR0–GBLRn are provided for read operations. In the FIG. 3C embodiment a single set of column select lines is provided for algorithm operations and a single set of column select lines is provided for read operations. That is, column select signals YW(0:15), ZW(0:3) drive algorithm column select circuitry to provide an algorithm data signal to algorithm data I/O line DIOW for algorithm operations. Column select signals YR(0:15), ZR(0:3) drive read column select circuitry to provide a read data signal to read data I/O line DIOR for read operations.

Figure 4:
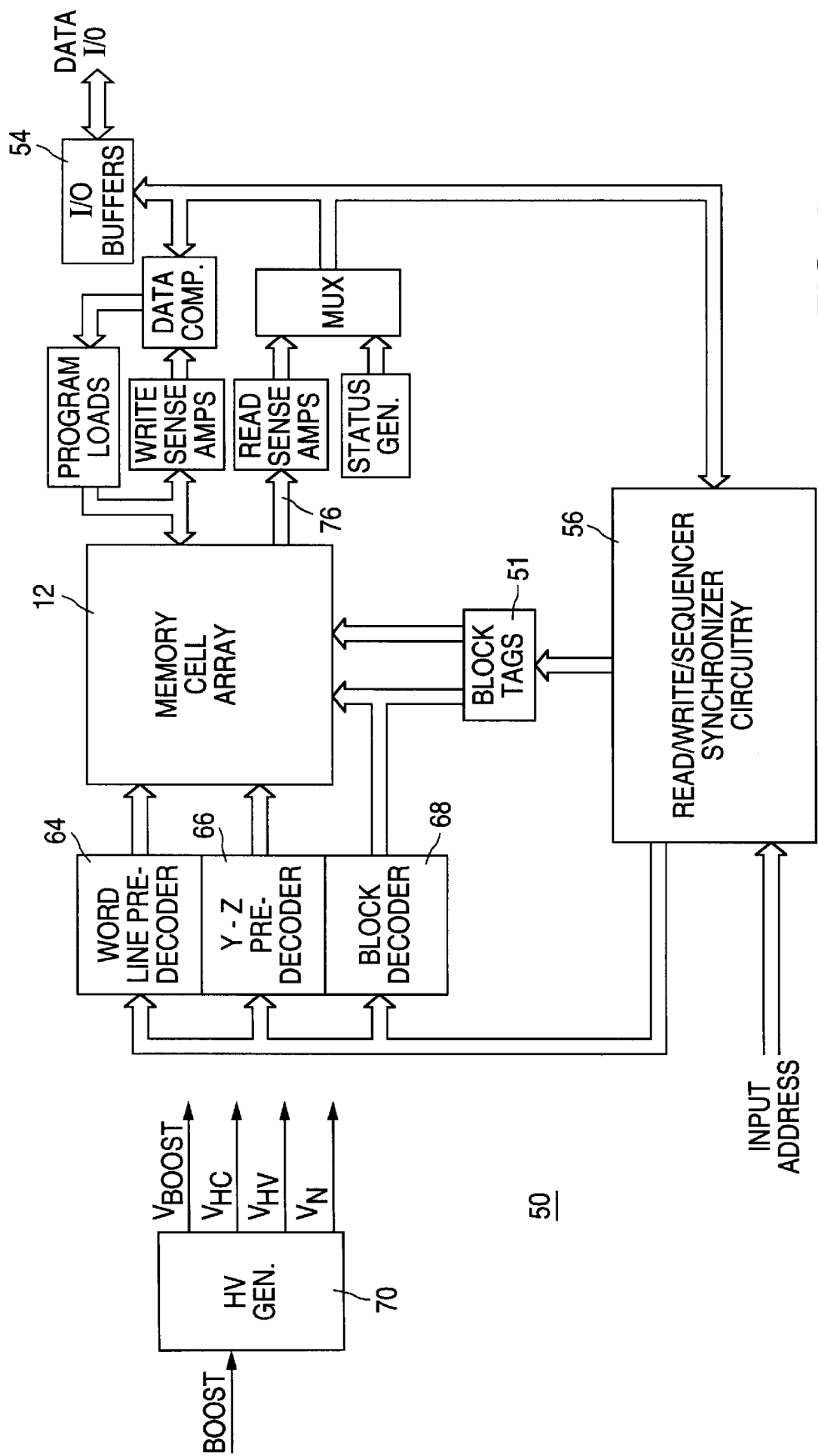
FIG. 4 is a block diagram illustrating a flash memory system that utilizes a simultaneous read/write flash memory architecture in accordance with the concepts of the present invention.
Figure 5:
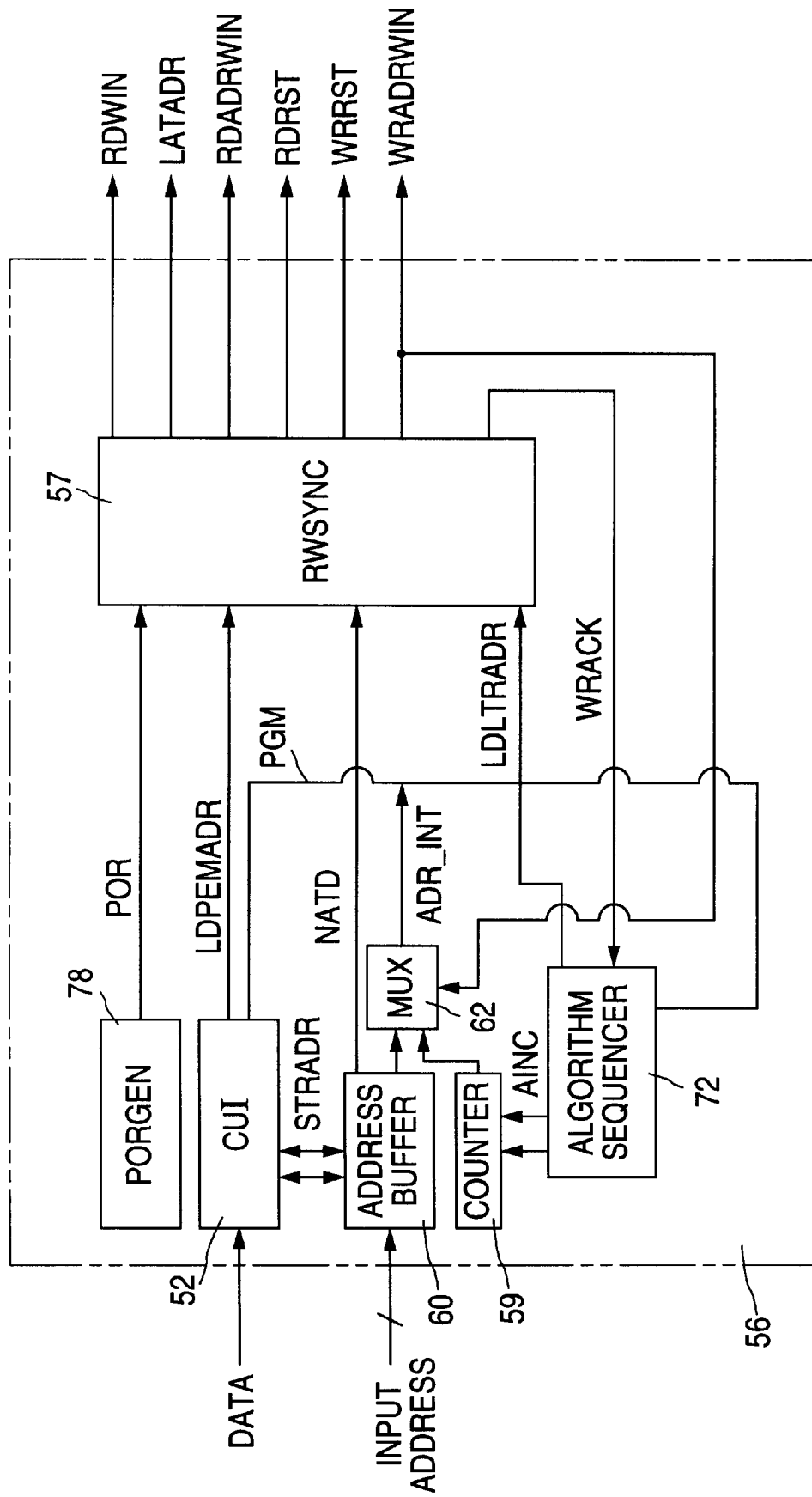
FIG. 5 is a block diagram illustrating portions of the FIG. 4 circuitry in greater detail.

FIGS. 4 and 5 show a flash memory system 50 that is based upon the flash EEPROM circuitry 10 discussed above in conjunction with FIGS. 1–3. FIG. 5 shows elements of the read/write/sequencer synchronizer circuitry 56 in greater detail.

As shown in FIG. 4, block tags 51 store information regarding the status of the array blocks 14. A tag for a particular array block 14 is set when that array block 14 is marked ("tagged") for an algorithm operation. There can be more than one array block 14 tagged for an algorithm operation, but an actual algorithm operation can be performed in only one "active" tagged array block 14 at a time.

As shown in FIG. 5, the flash memory system 50 includes a command user interface (CUI) 52 that receives user input data via I/O buffers (not shown). The user input data specifies, among other things, the mode of operation, i.e. read, program, erase, to be performed by the flash memory system 50. For byte program operation, the command user interface 52 issues a load program address signal LDPG-MADR that directs read/write synchronizer circuitry 57 to initiate loading of a program address (PA), latched in address counter 59, into the core. Input address information provided to address buffer 60 specifies, via multiplexer 62, the flash memory cell location within the array 12 at which the specified operation is to be performed. As shown in FIG. 4, word line WL pre-decoder circuitry 64, Y-Z pre-decoder circuitry 66 and block decoder circuitry 68, all conventional in design, provide, via internal address bus 16 (FIG. 1), the address control signal information required by the flash EEPROM circuitry 10 to implement the specified operation at the designated location in the cell array 12. The store address signal STRADR is asserted to store addresses in the internal latches. The bias voltages applied to the array 12 to implement the specified operation are provided by conventional high voltage generator circuitry 70 (FIG. 4).

If the specified operation is a read, then the read/write sequencer circuitry 57 generates the appropriate timing signals, as discussed in greater detail below. If the specified operation is an algorithm operation, such as a block erase or byte program operation, then the command user interface circuitry 52 activates, via signal PGM, algorithm sequencer circuitry 72 that sequences the various steps involved in implementing the block erase algorithm or the byte program algorithm.

In a read operation, data retrieved from the specified memory cells is provided to the read sense amplifiers 40 via the global read data I/O lines (DIOR) 36, as discussed above in conjunction with FIG. 3. Data retrieved from the specified memory cells during an algorithm operation is provided to the algorithm sense amplifiers 42 via global algorithm data I/O lines (DIOW) 38, also as discussed above in conjunction with FIG. 3.

Figure 6:
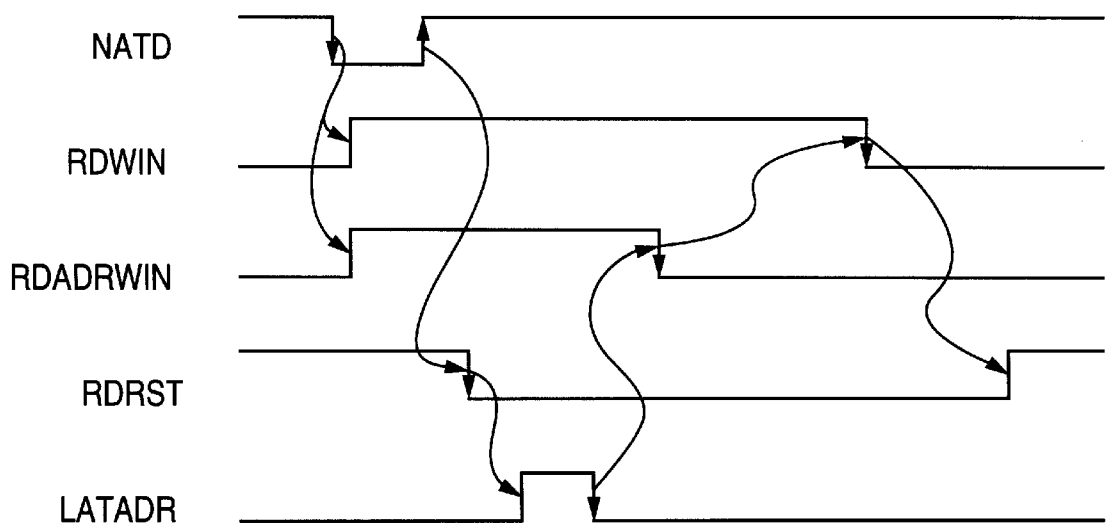
FIG. 6 is a timing diagram illustrating the waveforms of a normal read operation for a flash memory architecture in accordance with the concepts of the present invention.

FIG. 6 shows signal waveforms for a normal read operation utilizing the memory array system 50 described above in conjunction with FIGS. 4 and 5. Upon detection of an address transition in address buffer 60, the address transition detection signal NATD experiences a low-going pulse. On the falling edge of the NATD pulse, a read window signal RDWIN and a read address window signal RDADRWIN go high. The new read address propagates via the internal address bus 16 to the word line and column latches and to configure the passgate circuitry 44 for a read operation in the specified array block 14, as described above. On the rising edge of the NATD pulse, the read reset signal RDRST goes high-to-low. A predefined period of time after the NATD signal goes high, the latch address signal LATADR signal pulses high to load the read address into the latches at the specified array block 14. At the conclusion of the LATADR pulse, the read address window signal RDADRWIN goes low, signifying that the address bus 16 is now available for a subsequent operation, in accordance with the concepts of present invention. The RDWIN signal signifies an internal read cycle. The read cycle includes address decoding and latching in the respective array block, data sensing, and latching valid data from read sense amplifiers into output buffer circuitry. The RDADRWIN signal signifies read address decoding and latching in the respective array block via internal address bus 16. The word line WL driver, column drivers (Y<0:15>, ZR<0:3) in the associated read array block are reset when RDRST is high. Prior to LATADR going high, address decode should have been completed. The decoded read address is latched in the word line WL driver and column drivers (Y<0:15>, ZR<0:3>) in associated read array block when LADATR is high. Data sensing takes place after the address loading sequence is completed. RDADRWIN going low signifies that address loading is completed. After read data is sensed through the read sense amplifiers 40, RDWIN going low signifies that the internal read cycle is complete and read data is latched in output buffers.

Figure 6A:
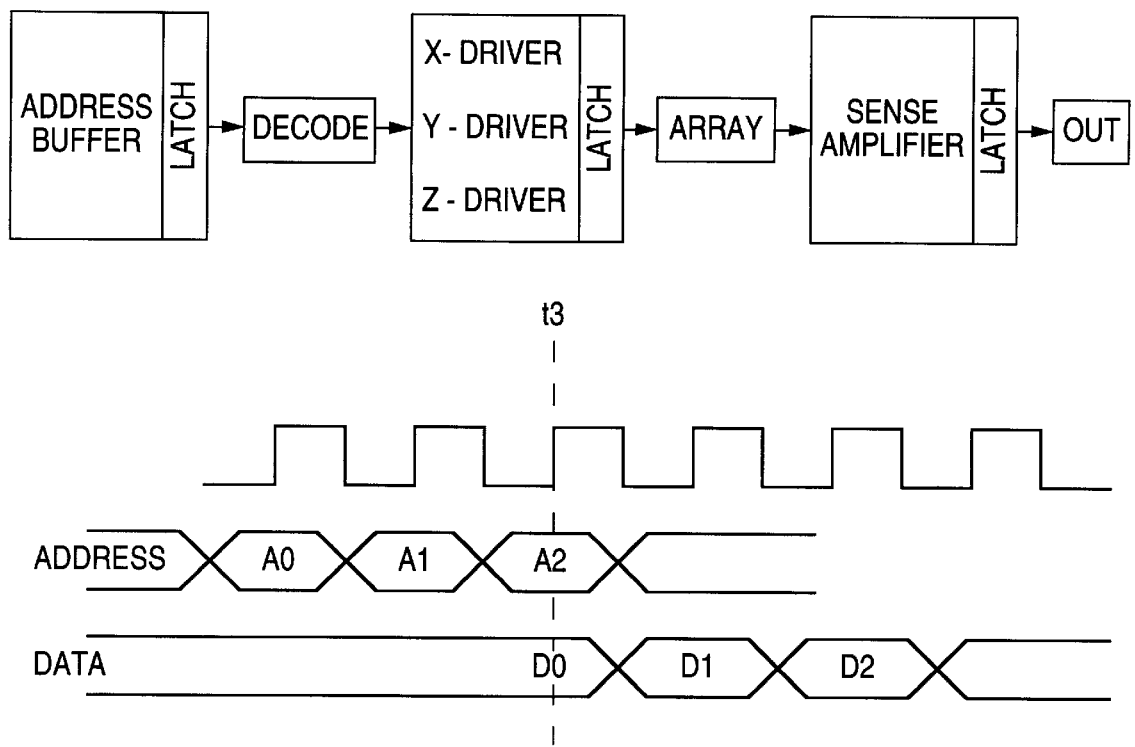
FIG. 6A illustrates external address pipelining during a read operation in accordance with the concepts of the present invention.

Referring to FIG. 6A, the present invention is capable of taking advantage of the pipelining of external addresses during a read operation. This is possible because of the existence of the latches in the address buffer, the X, Y and Z drivers and the sense amplifiers. This reduces the read cycle since at some point (+3), new data will be placed on the data I/O pins on every active edge of the clock.

Figure 7:
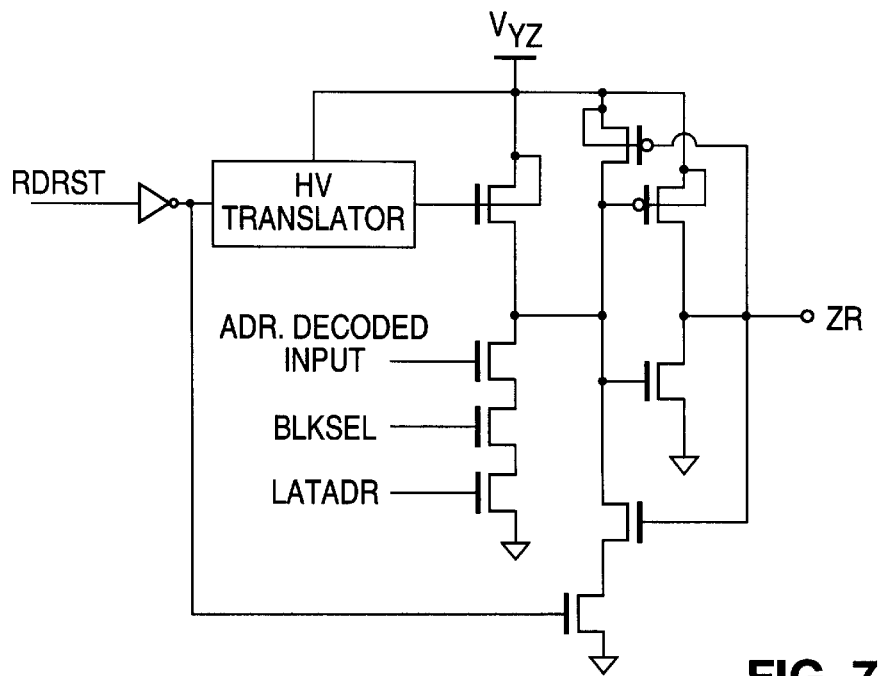
FIG. 7 is a schematic diagram illustrating an embodiment of a ZR driver utilizable in a flash memory architecture in accordance with the concepts of the present invention.

FIG. 7 shows an example of ZR driver circuitry that can be utilized in the flash memory system 50 shown in FIG. 4. The WL drivers, Y and ZW drivers are similar in configuration. For a given array, there can be one reset signal for all WL-drivers, one reset signal for all ZW drivers, and one reset signal for all ZR drivers. This reduces the necessity for a separate reset signal for each set of drivers.

Figure 8:
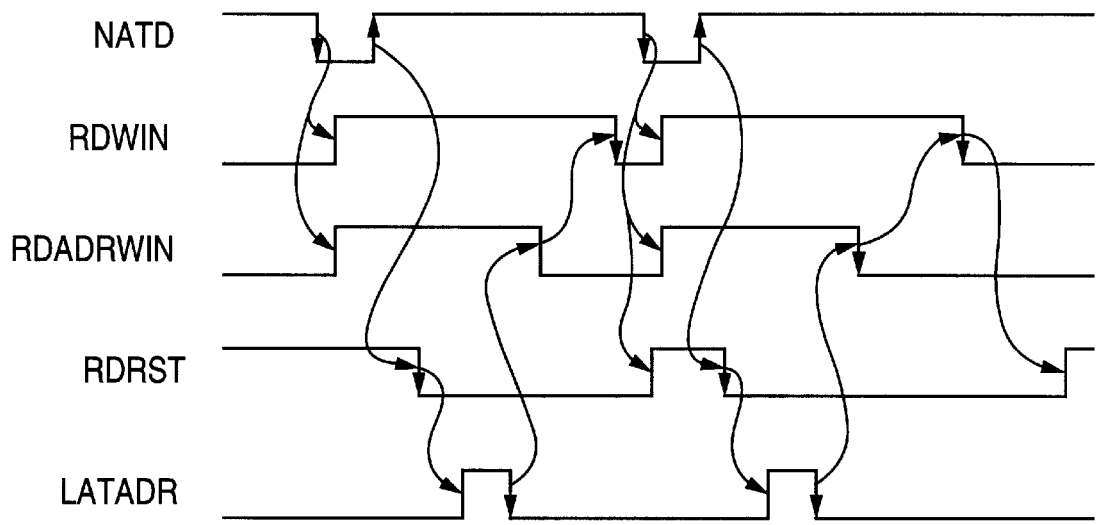
FIG. 8 is a timing diagram illustrating the waveforms for dual read cycles for a flash memory architecture in accordance with the concepts of the present invention.

FIG. 8 shows the waveforms for two back-to-back normal read cycles, as discussed above in conjunction with FIG. 6.

Figure 9:
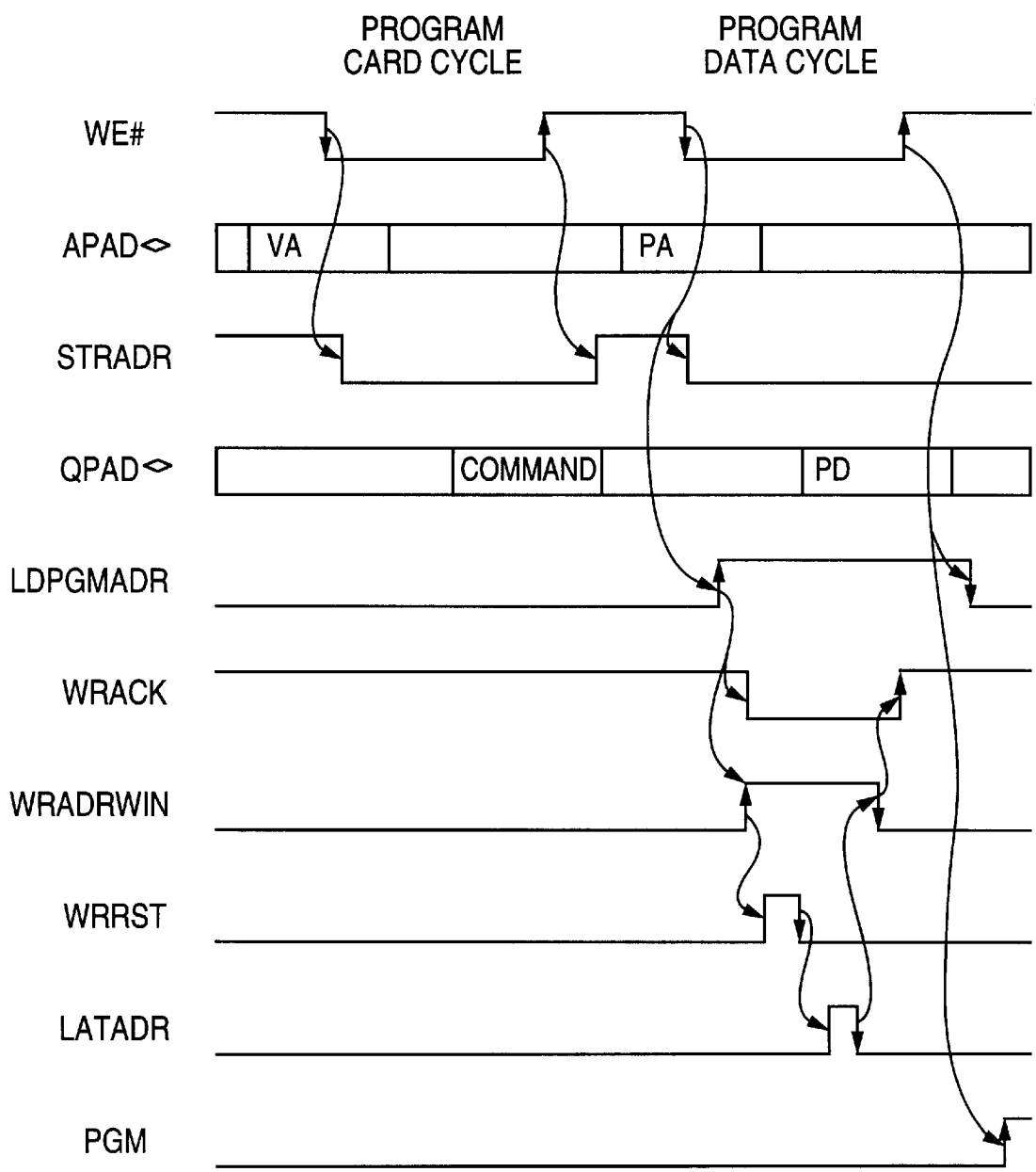
FIG. 9 is a timing diagram illustrating the waveforms for a byte program command sequence for a flash memory architecture in accordance with the concepts of the present invention.

The FIG. 9 waveforms show the command sequence for a byte program operation. As discussed above, the program address PA is loaded prior to the start of the byte program algorithm sequence. The command user interface 52 requests the read/write synchronizer 57 by asserting the load program address signal LDPGMADR to load the byte program address. Those skilled in the art will appreciate that there is no penalty on the byte program time because the byte program address is loaded during the command sequence. As stated above, the store address signal STRADR is asserted on the falling edge of the write enable signal WE#. When STRADR is high, the input program address is latched in the algorithm address counter 59. When LATADR is high, the decoded counter address is latched in the word line WL driver, column drivers (Y<0:15>, ZW<0:3>) and the block select driver in the associated active tagged array block 14. At the same time that the LDPGMADR signal goes high, the write address window signal WRADRWIN goes high to multiplex the address counter 59 to the internal address bus 16 (ADR_INT) and signifying that the internal address bus 16 is being used for an algorithm operation for counter address loading into the associated array block 14. The falling edge of the store address signal STRADR causes the write reset output WRRST to pulse high, resetting the wordline driver WL and column Y, ZR and ZW drivers for the tagged array blocks 14. Following a valid byte program command sequence (from the user), the CUI 52 asserts the PGM signal to activate the algorithm sequencer 72 to execute the byte program algorithm. At the end of the byte program algorithm, the algorithm sequencer 72 resets the PGM latch, i.e., de-asserts the PGM signal.

Figure 10:
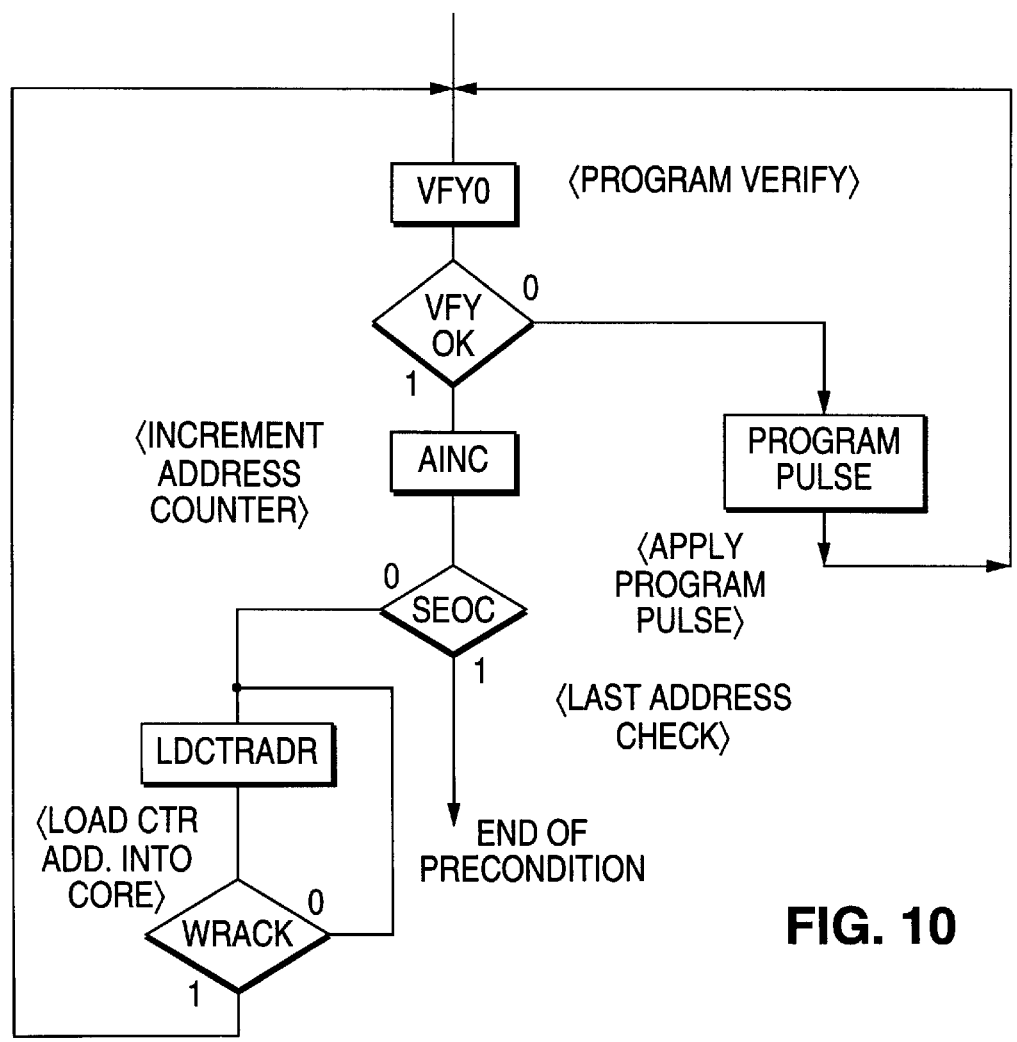
FIG. 10 is a flow chart illustrating the precondition sequence of the erase operation in a flash memory system in accordance with the concepts of the present invention.

FIG. 10 shows the precondition portion of an erase algorithm operation. Signal VFY0 is asserted for a program verify cycle. The data latch and compare logic generates signal a VFYOK signal based on program data and the output of the write sense amplifiers 42. When an erase algorithm operation has been requested, the program verify signal VFY0 output of the algorithm sequencer 72 circuit goes high. The VFYOK input signal to the algorithm sequencer 72 goes high when the algorithm sense amplifier data matches the expected data. Expected data can be input program data (PD), all 0's or all 1's, depending upon the operating mode. Algorithm sequencer 72 increments the address counter 59 by asserting signal AINC. After the address counter 59 is incremented, the algorithm sequencer 72 asserts LDCTRADR to request the read/write synchronizer 57 to load the counter address into the word line WL driver, column drivers (Y<0:15>, ZW<0:3>), and block select driver in the associated active tagged array block 14. The AIN1 output of the algorithm sequencer 72 goes high to reset/initialize the address counter 59. The AINC output of the algorithm sequencer 72 goes high to increment the address counter 59. The SEOC input to the algorithm sequencer 72 goes high when the address counter 59 reaches maximum count, i.e. the last address location in an array block 14, signaling the end of the erase precondition. Prior to that, i.e. when SEOC remains low, the load counter address signal LDCTRADR goes high to request the read/write synchronizer 57 to load the address counter value into the core. The write acknowledge output WRACK of the read/write synchronizer 57 goes low with the rising edge of the load counter program signal LDCTRPGM and goes high when the counter address value is successfully stored in the core. Upon asserting the LDCTRADR signal, the algorithm sequencer 72 remains in the "tpolling state" until the write acknowledge signal WRACK goes high.

Figure 11:
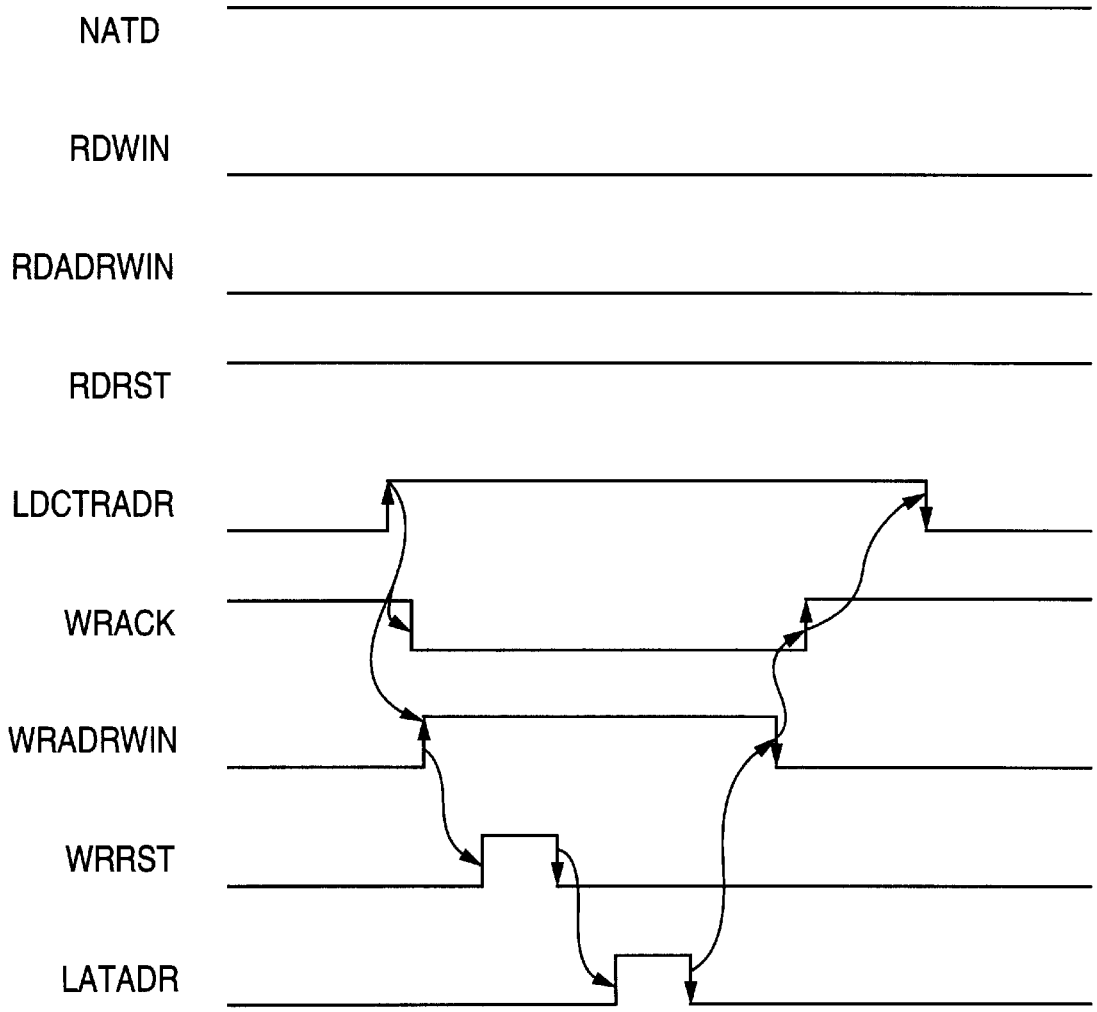
FIG. 11 is a timing diagram illustrating the waveforms for sharing an internal address to load the counter address for an erase algorithm in a flash memory architecture in accordance with the concepts of the present invention.

FIG. 11 shows the signal waveforms associated with loading an internal counter address into the array 12, i.e. to a specified array block 14, for an erase operation. The algorithm sequencer 72 requests the read/write sequencer 57 by asserting LDCTRADR to load the internal counter address into the selected block 14. On the high-going edge of the load address signal LDCTRADR, the write reset signal WRRST pulses high to reset the internal latches in the tagged block, the write address window signal WRADRWIN goes high to open the write address window, and the load (write) acknowledge signal WRACK goes low. With the write address window open, and following the lowgoing edge of the write reset signal pulse WRRST, the latch address signal LATADR pulses high to load the internal counter address into the internal latches. Upon completion of the address load, the low-going edge of the LATADR pulse enables the write acknowledge signal WRACK to go high, signaling that the internal address has been properly loaded and that the erase algorithm operation may proceed.

Figure 12:
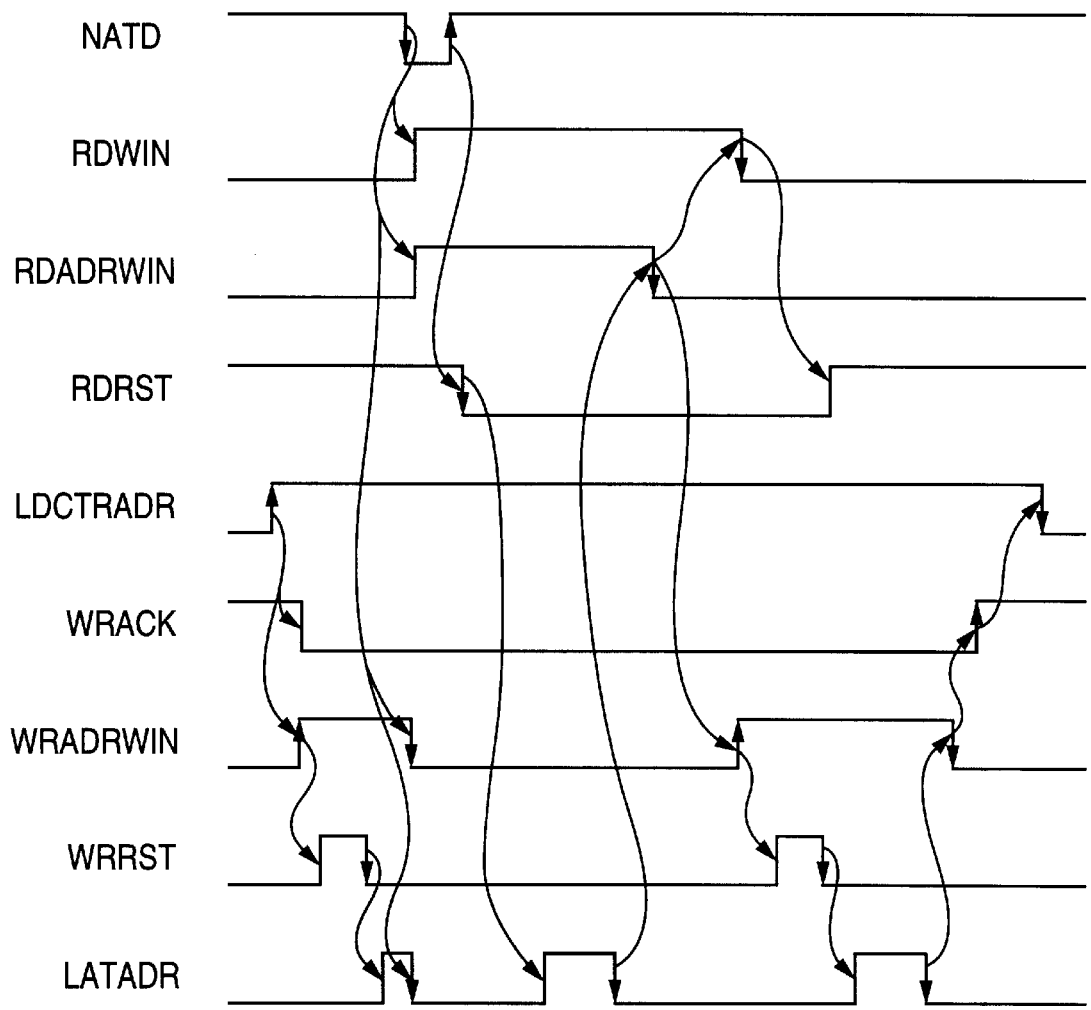
FIG. 12 is a timing diagram illustrating the waveforms for read operation interruption of a counter load for an algorithm operation in a flash memory architecture in accordance with the concepts of the present invention.

FIG. 12 shows the waveforms associated with a read operation interruption of an internal address load for an algorithm cycle. As stated above, a read request takes priority over an algorithm request for purposes of control of the internal bus 16. In the middle of loading the internal latches for an algorithm operation based upon signal LATADR, NATD goes low, indicating a read request. Since a read operation has higher priority, the write address window WRADRWIN is terminated (not completed). The above-described read sequence then follows. Soon after RDADRWIN goes low after loading the read address into the core, WRADRWIN goes high to obtain the internal address bus to load the counter address into the core. Note that the write acknowledge signal WRACK remains low during the read operation, indicating an incomplete loading of the internal latches in the block 14 selected for the terminated algorithm operation. When the read operation is completed, the write address window reopens to load the write address again.

It should be understood that various alternatives to the embodiments of the invention described herein may be employed in practicing the invention. It is intended that the following claims define the scope of the invention and that methods and structures within the scope of these claims and their equivalents be covered thereby.

What is claimed is:

1. Flash EEPROM circuitry that includes a flash memory cell array that is subdivided into a plurality of array blocks, and wherein each array block includes a plurality of flash memory cells, the flash EEPROM circuitry comprising:

an address bus connected to each array block for providing address information to the array blocks;

erase/reprogram operation circuitry connected to said address bus, the erase/reprogram operation circuitry being responsive to erase/reprogram operation address information provided on said address bus, the erase/reprogram operation address information identifying a first array block in which an erase/reprogram operation is to be performed, by performing the erase/reprogram operation in the first array block;

read operation circuitry connected to said address bus, the read operation circuitry being responsive to read operation address information provided on said address bus during performance of the erase/reprogram operation in the first array block, the read operation address information identifying a second array block in which a read operation is to be performed, by performing the read operation in the second array block simultaneously with the erase/reprogram operation being performed in the first array block.

2. A flash EEPROM system comprising:

a flash memory array that includes a plurality of array blocks, each array block including a plurality of flash memory cells, each array block having address storage means associated therewith for storing operation address information;

an address bus connected to each of the plurality of array blocks for providing operation address information to the address storage means associated with each of the array blocks;

means connected to the flash memory array for initiating a read operation in a first array block;

means connected to the address bus for providing read operation address information, via the address bus, to the address storage means associated with the first array block;

means connected to the flash memory array for initiating an erase/reprogram operation in a second array block, different from the first array block, by providing erase/reprogram operation address information to the second array block via the address bus, the erase/reprogram operation being initiated following the read operation address information being provided to the address storage means associated with the first array block and prior to completion of the read operation, whereby the read operation and the erase/reprogram operation are performed simultaneously in the first and second array blocks, respectively.

3. The flash EEPROM system as in claim 2, and further comprising:

a global read data I/O line;

a global erase/reprogram data I/O line; and associated with each array block, switching circuitry connected between (1) said array block and (2) said global read data I/O line and said global erase/reprogram data I/O line, the switching circuitry being responsive to read operation address information provided to said array block via the address bus for electrically connecting said array block to said global read data I/O line during performance of the read operation in said array block, the switching circuitry being responsive to erase/reprogram operation address information provided to said array block via the address bus for electrically connecting said array block to said global algorithm data I/O line during performance of the erase/reprogram operation in said array block.

4. A flash memory system comprising:

a flash memory array that includes a plurality of array blocks, each array block including a plurality of rows of flash memory cells and a plurality of columns of flash memory cells, each array block further including row decoder circuitry that responds to address information provided to said array block by accessing a selected row in said array block, each array block further including column decoder circuitry that responds to said address information by accessing a selected column in said array block;

an address bus connected to each of the plurality of array blocks for providing address information to said array blocks;

a global read data I/O line;

a global erase/reprogram data I/O line; and associated with each array block, switching circuitry connected between (1) said array block and (2) said global read data I/O line and said global erase/reprogram data I/O line, the switching circuitry being responsive to read operation address information provided to said column decoder circuitry associated with said array block for electrically connecting said selected read column in said array block to said global read data I/O line, the switching circuitry being responsive to erase/reprogram operation address information provided to said column decoder circuitry associated with said array block for electrically connecting said selected column in said array block to said global erase/reprogram data I/O line, whereby the read operation and the erase/reprogram operation are performed simultaneously in the first and second array blocks, respectively.

5. A flash memory system comprising:

a flash memory array that includes a plurality of array blocks, each array block including a plurality of rows of flash memory cells and a plurality of columns of flash memory cells, the plurality of columns of flash memory cells being subdivided into column sectors of columns of flash memory cells;

an address bus connected to each of the array blocks for providing address information thereto;

for each array block, a row decoder that responds to row address information provided to said array block via the address bus by accessing a selected row in said array block, the row decoder including row latch circuitry for storing said row address information;

for each array block, a column decoder that responds to column address information provided to said array block via the address bus by accessing a selected column in said array block, the column decoder including column latch circuitry for storing said column address information;

a plurality of global read data I/O lines selectively connectable to said column sectors of flash memory cells;

a plurality of global erase/reprogram data I/O lines selectively connectable to said column sectors of flash memory cells;

associated with each column sector of flash memory cells, passgate switching circuitry connected between (1) said column sector and (2) an associated global read data I/O line and an associated global erase/reprogram data I/O line, the passgate switching circuitry being responsive to read operation address information provided to the array block in which said column sector is included for electrically connecting a selected read column in said column sector to said global read data I/O line, the passgate switching circuitry being responsive to erase/reprogram operation address information provided to the array block in which said column sector is included for electrically connecting a selected erase/reprogram column in said column sector to said global erase/reprogram data I/O line, whereby a read operation and erase/reprogram operation are performed simultaneously in a first and second array blocks, respectvely.

6. The flash memory system as in claim 5, and further comprising:

for each global read data I/O line, a read sense amplifier connected thereto for receiving a read signal from said selected read column; and for each global erase/reprogram data I/O line, an erase/reprogram sense amplifier connected thereto for receiving an erase/reprogram signal from said selected erase/reprogram column.

7. The flash memory system as in claim 5, and further comprising:

for each global erase/reprogram data I/O line, a program load connected thereto.

8. The flash memory system as in claim 5, and further comprising:

read/write synchronizer circuitry connected to the flash memory array for initiating the read operation in the array block in which said selected read column is included;

means connected to the address bus for providing said read operation address information to the array block in which said selected read column is included;

erase/reprogram sequencer circuitry connected to the flash memory array for initiating the erase/reprogram operation in the array block in which said selected erase/reprogram column is located, the erase/reprogram operation being initiated following the read operation address information being provided to the array block in which the selected read column is included and prior to completion of the read operation, whereby the read operation and the erase/reprogram operation are performed simultaneously.

9. A method of simultaneously performing a read operation and an erase/reprogram operation in a flash memory array, wherein the flash memory array is subdivided into a plurality of array blocks, each array block including a plurality of flash memory cells, an address bus being connected to each array block for providing address information to the array blocks, the method comprising:

providing erase/reprogram operation address information on the address bus to initiate an erase/reprogram operation in a first array block; and during performance of the erase/reprogram operation in the first array block, providing read address information on the address bus to initiate a read operation in a second array block that is different from the first array block, whereby the erase/reprogram operation is performed in the first array block simultaneously with the read operation being performed in the second array block.

10. A method of simultaneously performing a read operation and an erase/reprogram operation in a flash memory system, wherein the flash memory system includes a flash memory array that includes a plurality of array blocks, each array block including a plurality of flash memory cells, each array block having address storage means associated therewith for storing operation address information, the flash memory system further including an address bus connected to each of the array blocks for providing operation address information to the address storage means associated with each of the array blocks, the method comprising:

initiating an erase/reprogram operation in a first array block;

providing erase/reprogram operation address information, via the address bus, to the address storage means associated with the first array block;

initiating a read operation in a second array block that is different from the first array block by providing read address information to the second array block via the address bus, the read operation being initiated following the erase/reprogram operation address information being provided to the address storage means associated with the first array block and prior to completion of the erase/reprogram operation, whereby the erase/reprogram operation and the read operation are performed simultaneously in the first and second array blocks, respectively.

11. The method as in claim 10, and further comprising:

responding to the read operation address information being provided to said first array block by connecting the first array block to a global read data I/O line during performance of the read operation in the first array block; and responding to the erase/reprogram operation address information being provided to the second array block by connecting the second array block to a global read data I/O line during performance of the erase/reprogram operation in the second array block.

12. A method of simultaneously performing a read operation and an erase/reprogram operation in a flash memory array, wherein the flash memory array includes a plurality of array blocks, each array block including a plurality of rows of flash memory cells and a plurality of columns of flash memory cells, each array block further including row decoder circuitry that responds to address information provided to the array block by accessing a selected row in said array block, each array block further including column decoder circuitry that responds to said address information by accessing a selected column in said array block, the flash memory system further including an address bus connected to each of the plurality of array blocks for providing address information to said array blocks, the method comprising:

responding to erase/reprogram operation address information provided to column decoder circuitry associated with an array block by electrically connecting the selected column in said array block to a global data I/O line; and responding to read operation address information provided to a column decoder circuitry associated with an array block by electrically connecting the selected column in said array block to a global read data I/O line, whereby the read operation and the erase/reprogram operation are performed simultaneously in a first and second array blocks, respectibely.

* * * * *